Figure 1:
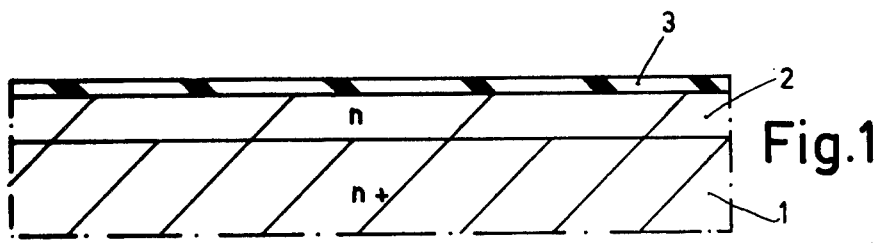

United States Patent [19]

Summers et al.

[11] 4,028,140

[45] June 7, 1977

[54] SEMICONDUCTOR DEVICE MANUFACTURE

[75] Inventors: John Gilbert Summers, Crowborough; Maurice Pierrepont, Horley, both of England

[73] Assignee: U.S. Philips Corporation, New York, N.Y.

[22] Filed: Oct. 22, 1975

[21] Appl. No.: 624,726

[30] Foreign Application Priority Data

Oct. 29, 1974 United Kingdom ............ 46726/74

[52] U.S. Cl. ................................ 148/1.5; 148/171; 148/187; 148/33.2; 357/13; 357/56; 156/649
[51] Int. Cl.² ...................................... H01L 21/265
[58] Field of Search ................. 148/187, 1.5, 33.2; 357/13, 56; 156/17

[56] References Cited

UNITED STATES PATENTS

| | | | |
|---|---|---|---|
| 3,226,268 | 12/1965 | Bernard | 357/56 |
| 3,509,428 | 4/1970 | Mankarious et al. | 357/56 |
| 3,510,734 | 5/1970 | Mankarious et al. | 357/56 |
| 3,808,555 | 4/1974 | Goedbloed | 357/56 |
| 3,886,580 | 5/1975 | Calviello | 357/56 |

FOREIGN PATENTS OR APPLICATIONS 1,226,153  3/1971  United Kingdom ............. 148/187

*Primary Examiner*—G. Ozaki
*Attorney, Agent, or Firm*—Frank R. Trifari

[57] ABSTRACT

A method of directly etching an inverted-mesa semiconductor structure, wherein the mesa is first formed by shallow etching from the epitaxial layer surface and then undercut by preferentially etching the substrate more rapidly than the epitaxial layer.

9 Claims, 5 Drawing Figures

U.S. Patent   June 7, 1977   4,028,140

SEMICONDUCTOR DEVICE MANUFACTURE

This invention relates to methods of manufacturing a semiconductor device comprising the steps of:

a. providing a semiconductor layer of one conductivity type on a semiconductor body portion of the same conductivity type but higher conductivity, b. forming an etch-masking layer on part of the semiconductor layer surface, and c. subjecting the semiconductor layer surface to an etching treatment which etches through the semiconductor layer where exposed around said etch-masking layer to leave a mesa portion of the semiconductor layer under said etch-masking layer and to expose the part of said semiconductor body portion around said mesa portion.

The invention further relates to semiconductor devices, particularly but not exclusively avalanche diodes for operation at microwave frequencies, when manufactured by such methods.

A known method of manufacturing microwave avalanche diodes is described in an article on "Impatt diodes" by de Nobel and Vlaardingerbroek in Philips Technical Rqview, Vol. 32 (1971) No. 9/10/11/12, pages 328 to 344. An n-type semiconductor layer is epitaxially grown on an n-type semiconductor substrate of higher conductivity. A p-n junction is formed adjacent the surface of the semiconductor layer by diffusing a high concentration of acceptor impurity into the layer surface. The layer surface is metallized and attached to a heat sink. An etchmasking layer is formed on the back surface of the substrate, and the substrate and semiconductor layer are selectively etched from this back surface to divide the substrate and semiconductor layer into discrete semiconductor bodies for each diode and to divide the p-n junction into discrete junctions for each semiconductor diode. This etching process defines the area of the junction and the active region of each diode, as shown in FIGS. 23 and 24 of said article. In addition the resulting side of each semiconductor body splays outward as it extends from the bottom of the substrate portion to the top of the semiconductor layer portion so that the area of the layer portion increases from its interface with the substrate. This provides a bevel at which the p-n junction terminates, and this bevel increases the device breakdown voltage as described with reference to FIG. 21 of said article. The resulting device is commonly called an "inverted-mesa" structure.

However, the Applicants have found that it can be difficult to control the area of the diode junction and active region formed by such deep etching, that the etching can produce a rough surface at the part of the side where the previously-provided p-n junction terminates, that the etching can affect the metallization interfacing with the heat sink, and that the overhanging edge of the diode body adjacent the heat sink may be thin and brittle. In addition the side of the mesa is not passivated by, for example, an oxide layer. As a result, inferior diode characteristics sometimes occur for such inverted-mesa diodes.

Figure 2:
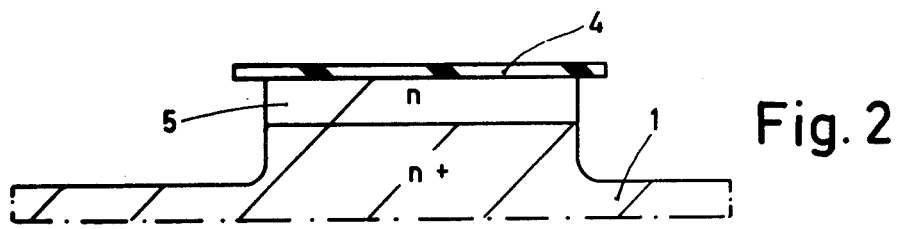

I.E.E.E. Transactions on Electron Devices Vol. ED-18 No. 1 January 1971 pages 54 to 57, describe a silicon-nitride masked, thermally oxidized and post-diffused mesa process for semiconductor device manufacture. The process steps are shown in FIG. 2 of this article, and involve using a so-called LOCOS (Local oxidation of silicon) process as described by Appels, Kooi et al in Philips Research Reports Vol 25, No. 2, (April 1970) pages 118 to 132, and at the Third Conference on Solid State Devices, Exeter (England), September 1969. In this method, a shallow etch from the surface of the semiconductor layer is used to selectively etch through the semiconductor layer to leave mesa portions of the layer. The sides of these mesa portions are oxidized and p-n junctions are formed in the top of the mesa-portions by impurity diffusion. One disadvantage of this process is that the side of the mesa portion is bevelled in such a sense that the area of the layer mesa portion decreases from its interface with the substrate portion. Thus, the p-n junction forms with the bevelled side of the mesa portion an obtuse angle at the lower-doped side (n-type) of the junction. As described with reference to FIG. 21 of said Philips Technical Review article, this produces a lower breakdown voltage due to edge breakdown effects.

According to the present invention, a method of manufacturing a semiconductor device comprises the steps of:

a. providing a semiconductor layer of one conductivity type on a semiconductor body portion of the same conductivity type but higher conductivity, b. forming an etch-masking layer on part of the semiconductor layer surface.

c. subjecting the semiconductor layer surface to an etching treatment which etches through the semiconductor layer where exposed around said etch-masking layer to leave a mesa portion of the semiconductor layer under said etch-masking layer and to expose the part of said semiconductor body portion around said mesa portion, and d. while using the etch-masking layer to mask the top of said mesa-portion, subjecting the exposed parts of said semiconductor body portion and said mesa portion to further etching which includes removing the material of said semiconductor body portion faster than that of said semiconductor layer to etch under said mesa portion of the semiconductor layer and cause the whole upper edge of said mesa portion to overhang the adjacent etched surface, the side of said mesa portion being bevelled by the further etching so that the area of the resulting mesa portion of the semiconductor layer increases from its interface with said semiconductor body portion.

By using such a method, the side of the mesa portion is provided with a desired bevel by shallow etching from the semiconductor layer surface rather than by deep etching from the back surface of the substrate. Thus the area of a rectifying junction and active device area formed in said mesa portion can be readily controlled, and the bevelled side can serve to increase the breakdown voltage.

Furthermore, the etching which bevels the side of said mesa portion may be terminated before said bevel extends to the upper edge of said mesa portion to avoid forming an easily-damaged upper edge.

Both the etch-masking layer and the overhanging upper edge of said mesa portion can be used for masking during subsequent processing steps. Thus, for example, the etch-masking layer may serve as an oxidation mask when providing a passivating layer on the side of the mesa portion by oxidation. The overhanging upper edge may shadow-mask underlying portions against for example implantation to form a p-n junction in the mesa portion or against metallization, as described in detailhereinafter. In this manner, extra processing steps, especially mask registration steps, can be avoided.

An embodiment of the invention will now be described, by way of example, with reference to the accompanying diagrammatic drawings, in which FIGS. 1 to 5 are cross-sectional views of a semiconductor wafer portion at successive stages in the manufacture of a microwave avalanche diode using a method in accordance with the present invention.

The starting material is an n-type monocrystalline silicon substrate 1 having a donor impurity concentration of the order of $10^{18}$ atoms/c.c. In known manner, an n-type silicon layer 2 is epitaxially grown on the substrate 1 with a donor impurity concentration of the order of, for example, $10^{15}$ or $10^{16}$ atoms/c.c. The thickness of the layer 2 in a typical case is approximately 6 microns; however its thickness may be in the range of 2 to 8 microns, for example, depending on the avalanche diode to be manufactured.

In known manner, for example, as described in Philips Research Reports, Vol. 25, No. 2, pages 118 to 132, a layer 3 of etch-masking and oxidation masking material is provided on the surface of the layer 2. The resulting structure is shown in FIG. 1. The layer 3 may comprise a layer of silicon nitride having a thickness of, for example, between 0.15 and 0.2 micron.

As described in said Philips Research Report article, a silicon oxide layer is deposited on the nitride from a silane reaction and by known photolithographic and etching techniques a pattern of dots is first etched in the top oxide, and then through the nitride using the top oxide as an etchant mask. In this manner dots 4 of the etchant and oxidation masking material are formed on the silicon layer surface. For convenience only one dot 4 is shown in the drawings.

Before etching to form the dots 4, the substrate 4 may be thinned by etching from the back surface until the desired thickness is obtained, for example a combined thickness of 100 microns for the layer 2 and thinned substrate 1.

After forming the masking layer dots 4, the semiconductor layer 2 is subjected to an etching treatment using a first etchant which etches through the layer 2 where exposed around the dots 4 to leave mesa portions 5 of the layer 2 under the dots 4 and to expose the substrate 1 around each mesa portion 5. This first etchant may be for example a known solution comprising nitric, acetic and hydrofluoric acids. The resulting structure is shown in FIG. 2.

Figure 4:
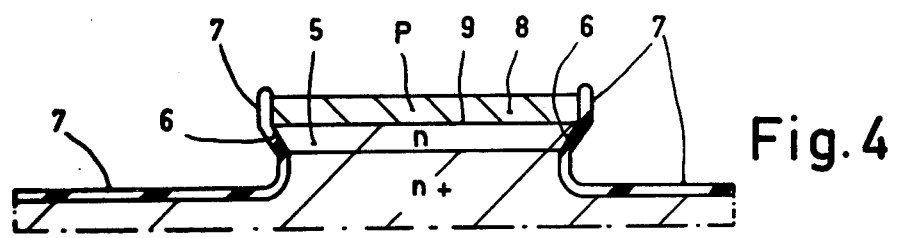
Figure 5:
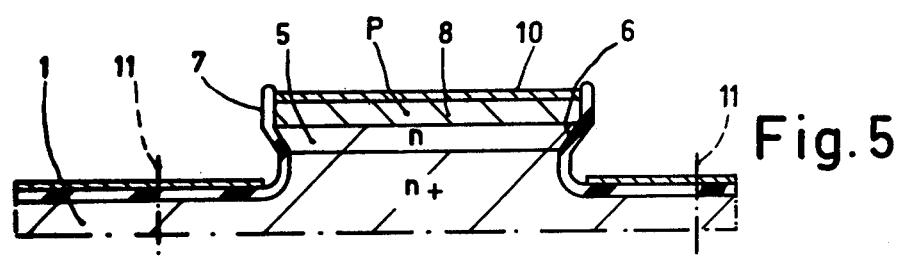

Then, while using the masking layer dot 4 to mask the top of the mesa portion 5, the exposed parts of the substrate 1 and the mesa portion 5 are subjected to further etching treatment which includes removing the substrate material faster than the epitaxial layer material. This may be effected in a simple manner using an electrolytic etch, for example similar to that described in U.K. 1,226,153 to which reference is invited. Thus, the back surface of the substrate 1 is protected, for example by coating with a masking material, and by means of a clip an anode connection can be made to the exposed top surface of the substrate 1. The wafer 1 may then be subjected to a selective electrolytic etching treatment by immersing in a liquid electrolyte together with a cathode electrode. The general arrangement is shown in FIG. 4 of said U.K. Pat. 1,226,153. The electrolyte may consist of dilute aqueous HF-solution obtained by, for example, mixing 1 part by volume of concentrated hydrofluoric acid (50% by weight) with 10 parts by volume of water. This electrolytic treatment etches away the exposed, higher conductivity substrate portion 3 faster than the lower conductivity epitaxial material to etch under the mesa portion 5 around its bottom edge and to cause the whole upper edge of the mesa portion 5 to overhang the adjacent etched surface.

Figure 3:
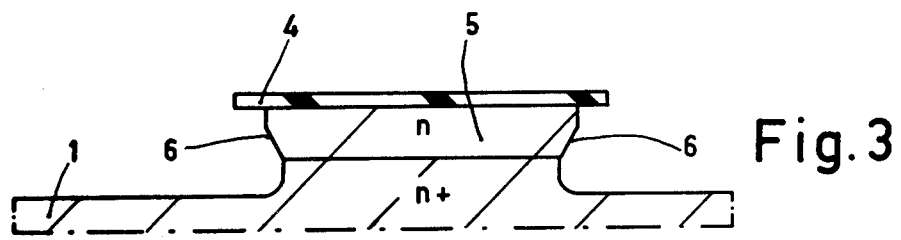

The Applicants have found that for samples having a layer 2 of doping $10^{16}$ on a substrate 1 of doping $10^{18}$, after some minutes this electrolytic etching bevels the side of the mesa portion 5 as shown in FIG. 3. The bevel 6 results from the slower, but still appreciable, etching of the epitaxial layer mesa portion 5 as its bottom edge becomes exposed by etching away the underlying substrate portion.

With higher resistivity (lower-doped) epitaxial layers 2, the Applicants have found that the electrolytic etching results in a step rather than a bevel 6. In this case, after terminating the electrolytic etching, the semiconductor wafer may be subjected to another etching treatment to etch the exposed side and bottom edge of the mesa portions 5 and so smooth away the step and form the bevel 6. This other treatment etches the epitaxial material at least as fast as the substrate material, and the etchant used may be said first etchant, for example the known nitric, acetic and hydrofluoric acid composition. In this case, the undercutting of the mesa portions 5 is effected in a first (electrolytic etching) step and the bevelling is effected in a second (non-electrolytic etching) step.

The bevel 6 is such that the side of the mesa portion 5 splays outward and it extends upward from the bottom of the mesa portion 5, and the area of the mesa portion 5 of the layer increases from its interface with the substrate 1. The etching which bevels the side of the mesa portions 5 is preferably terminated before the bevel 6 extends to the upper edge of the mesa portions 5 so that this upper edge is less susceptible to breakage. The bevel 6 may be terminated at least for example 0.2 micron from the top of the mesa portions 5.

After forming the bevel 6 and while using the etch-masking layer 4 to mask the top of the mesa portions 5 the exposed silicon is subjected to an oxidation treatment to grow an insulating and passivating layer 7 of silicon oxide on the bevelled side of each mesa portions 5 and on the surface of substrate 1 around said mesa portions 5. Details of suitable oxidation treatments are given in said Philips Research Report article and said I.E.E.E. Transactions on Electron Devices article. The oxide may be grown to a thickness of, for example, 0.5 micron. After the oxidation the masking layer 4 is removed by etching in known manner with phosphoric acid.

In an ion implantation machine boron ions are directed at the upper surface of the substrate 1 with the mesa portions 5. Typically an ion beam energy of 30 keV and a dose of $10^{15}$ boron ions/sq.cm. may be used. The boron is implanted in the exposed top of the mesa portions 5 to a depth of 0.3 micron. With a 0.5 micron thick oxide layer 7, the boron ions do not penetrate through the oxide layer 7. With a thinner oxide layer 7 the boron ions may penetrate through the layer 7, but in this case the overhang of the whole upper edge of the mesa portions 5 shadow-masks the underlying substrate portion and side of the mesa portions 5 against implantation.

After heating to anneal in known manner a p-type surface zone 8 is formed in the top of each mesa portion 5 with a surface doping of, for example, approximately $10^{19}$ boron atoms/c.c. The p-n junction 9 formed by the p-type surface zone 8 in each n-type eptiaxial mesa portion 5 terminates at the bevel 6 in the side of the mesa portion 5 and below the oxide layer 7. The resulting structure is shown in FIG. 4.

Although it is advantageous to form the p-n junction 9 below a passivating oxide layer 7, for some avalanche diodes it would be acceptable to omit the oxidation stage and implant the p-type surface zone 8 in the structure shown in FIG. 3 after removing the masking layer 4.

When the layer 7 is provided, instead of implanting the p-type surface zone 8, this zone 8 may be formed by boron diffusion after removing the masking layer 4. In this case, the layer 7 would selectively mask the silicon surface against boron diffusion to localize the boron-doped zone to the exposed top of each mesa portion 5.

It should be noted that in the structure of FIG. 4, the bevel 6 serves to increase the breakdown voltage of the device by reducing in operation the surface electric field. In particular at the lowerdoped side of the junction 9, i.e., in the n-type mesa portion, the junction 9 forms an acute angle with the bevel 6.

Subsequently, metal is evaporated to provide a metallic contact 10 on the exposed top of each mesa portion 5 the side of the mesa portion 5 being shadow masked against the metal by the overhanging upper edge of the mesa portion 5. Typical metallization would be 0.4 micron of gold on 0.3 micron of platinum or palladium or 0.2 micron of titanium. The contact 10 may subsequently be plated with gold, and may be bonded to a heat-sink after dicing the semiconductor wafer into discrete semiconductor bodies along the lines 11 of FIG. 5.

It should be noted that the metallization is also evaporated on the substrate 1 around each mesa portion 5. This superfluous metallization may be removed by etching after the gold plating. However because of the shadow masking effect of the upper edge of each mesa portion 5, this superfluous metallization is not connected to the contact portion 10 and may be retained in the final device. When no insulating layer 7 is present the retention of this superfluous metallization on the upper surface of the substrate 1 could be advantageous at very high frequencies where a current skin-effect is significant.

Contact to the substrate 1 is made by metallizing the back of the substrate 1 in known manner before dicing the semiconductor wafer.

The semiconductor wafer can be diced using known techniques either to scribe the substrate 1 between the mesa portions 5 and then break or to etch from a masking pattern on the back of the substrate 1.

It will be obvious that many modifications are possible. Thus, for example gas plasma etching may be used to form the mesa portions 5. Instead of p-n junction avalanche diode a Schottky avalanche diode may be formed from the mesa portions 5. In this case, no p-n junction 9 is produced but the metal electrode 10 is of a metal which forms a metal/semiconductor Schottky junction with the n-type mesa portion 5, and preferably the bevel 6 extends to the top of the mesa portion 5. The technique of bevelling by etching from a semiconductor layer surface can be applied to devices other than microwave avalanche diodes, for example, rectifier diodes, and thyristors.

What we claim is:

1. A method of manufacturing a semiconductor device comprising the steps of
   a. providing a semiconductor layer of one conductivity type on a semiconductor body portion of the same conductivity type but higher conductivity,
   b. forming an etch-masking layer on part of the semiconductor layer surface,
   c. subjecting the semiconductor layer surface to an etching treatment which etches through the semiconductor layer where exposed around said etch-masking layer to leave a mesa portion of the semiconductor layer under said etch-masking layer and to expose the part of said semiconductor body portion around said mesa portion, and
   d. while using the etch-masking layer to mask the top of said mesa-portion, subjecting the exposed parts of said semiconductor body portion and said mesa portion to further etching which includes removing the material of said semiconductor body portion faster than that of said semiconductor layer to etch under said mesa portion of the semiconductor layer and cause the whole upper edge of said mesa portion to overhang the adjacent etched surface, the side of said mesa portion being bevelled by the further etching so that the area of the resulting mesa portion of the semiconductor layer increases from its interface with said semiconductor body portion.

2. A method as claimed in claim 1, which said further etching comprises a single etching treatment which also etches the exposed side and bottom edge of said mesa portion sufficiently to provide the bevel of said side.

3. A method as claimed in claim 1, in which said further etching comprises a first etching treatment to etch under said mesa portion and a second etching treatment which removes the material of the semiconductor layer at least as fast as that of said semiconductor body portion to etch the exposed side and bottom edge of said mesa portion to provide the bevel on said side.

4. A method as claimed in claim 1, in which the etching which bevels the side of said mesa portion is terminated before said bevel extends to the upper edge of said mesa portion.

5. A method as claimed in claim 1, in which after bevelling the side of said mesa portion dopant characteristic to the opposite conductivity type is introduced into the top of said mesa portion to form with the mesa portion of the semiconductor layer of said one conductivity type a p-n junction which terminates at the bevel in the side of said mesa portion.

6. A method as claimed in claim 5, in which said dopant is introduced by directing dopant ions at said semiconductor layer surface which dopant ions are implanted in the top of the mesa portion while the overhanging edge of said mesa portion masks underlying semiconductor portions against implantation.

7. A method as claimed in claim 5, in which the semiconductor layer and body part are of silicon and the etch-masking layer comprises a material masking against oxidation, and after bevelling the side of said mesa portion and while using the etch-masking layer to mask the top of said mesa portion the exposed silicon is subjected to an oxidation treatment to grow an insulating and passivating layer of silicon oxide on the bevelled side of said mesa portion and on the surface of said semiconductor body portion around said mesa portion.

8. A method as claimed in claim 7, in which said dopant of the opposite conductivity type is introduced into the top of said mesa portion by impurity diffusion after removing said etch-masking layer and while using said silicon oxide layer as diffusion mask.

9. A method as claimed in claim 5, in which after forming said p-n junction, metal is evaporated to provide a metallic contact on the exposed top of said mesa portion, the side of said mesa portion being masked against the metal by the overhanging upper edge of said mesa portion.

* * * * *